US006876706B1

United States Patent
Xu

(10) Patent No.: US 6,876,706 B1
(45) Date of Patent: Apr. 5, 2005

(54) METHOD FOR COMMON SOURCE AND CHANNEL CODING

(75) Inventor: Wen Xu, Unterhaching (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/787,997

(22) PCT Filed: Jul. 1, 1999

(86) PCT No.: PCT/DE99/01993

§ 371 (c)(1),
(2), (4) Date: Mar. 23, 2001

(87) PCT Pub. No.: WO00/18015

PCT Pub. Date: Mar. 30, 2000

(30) Foreign Application Priority Data

Sep. 24, 1998 (DE) .......................... 198 43 981

(51) Int. Cl.[7] .............................................. H04B 14/04
(52) U.S. Cl. ...................... 375/243; 375/262; 375/341; 714/758; 714/780; 714/794
(58) Field of Search ............................. 375/262, 265, 375/260, 263, 254, 391; 714/702, 701, 746, 752, 758, 774, 780, 796

(56) References Cited

U.S. PATENT DOCUMENTS

| | | | | |
|---|---|---|---|---|
| 4,626,829 A | * | 12/1986 | Hauck ........................... | 341/63 |
| 5,058,144 A | * | 10/1991 | Fiala et al. .................. | 375/240 |
| 5,289,501 A | * | 2/1994 | Seshadri et al. ............. | 375/286 |
| 5,475,388 A | * | 12/1995 | Gormish et al. ............. | 341/107 |
| 6,049,633 A | * | 4/2000 | Cho ............................ | 382/247 |
| 6,233,713 B1 | * | 5/2001 | Van Den Berghe et al. | 714/790 |
| 6,348,880 B1 | * | 2/2002 | Xu ............................... | 341/50 |

OTHER PUBLICATIONS

"Source–Controlled Channel Decoding," Hagenauer, IEEE Trans. on Comm., vol. 43, No. 9, Sep. 1995, pp. 2449–2457.
"Channel Decoding Using Residual Intra–frame Correlation in a GSM System," Ruscitto et al., Electronics Letters, vol. 33, No. 21, Oct. 9, 1997, pp. 1754–1755.

* cited by examiner

*Primary Examiner*—Dac V. Ha
(74) *Attorney, Agent, or Firm*—Bell, Boyd & Lloyd LLC

(57) ABSTRACT

In a method, and a signal processing arrangement, for coding information, the information symbol sequences are first sorted in accordance with the probability of occurrence of the symbols in the sequences, and are then mapped to the natural binary code. This allows redundant information contained in the symbol sequences to be used for decoding the bit positions.

12 Claims, 3 Drawing Sheets

METHOD FOR COMMON SOURCE AND CHANNEL CODING

BACKGROUND OF THE INVENTION

1. Field of the Invention

The present invention relates to a method for coding and decoding information, especially for digital transmission or storage.

2. Description of the Prior Art

Source signals or source information such as voice, sound, image and video signals almost always contain statistical redundancy, that is to say redundant information. This redundancy can be greatly reduced by source encoding, making it possible to transmit and/or store the source signal efficiently. This redundancy reduction eliminates redundant signal contents which are based on the prior knowledge of, for example, statistical parameters of the signal variation, before the transmission. After the transmission, these components are added to the signal again in the source decoding, so that no loss of quality can be detected objectively.

Due to the incomplete knowledge of the source signals or restrictions in the complexity of the source encoding method, the source encoding usually only can be implemented in a suboptimum way, that is to say the compressed data still contain a certain redundancy even after the source encoding. In previous methods for source encoding, the source signals are frequently compressed to form symbols or quantized parameters which are then mapped to binary code words in accordance with an allocation rule, the allocation rule having been selected more or less randomly until now.

On the other hand, it is usual to deliberately add redundancy again by channel encoding during the signal transmission in order to largely eliminate the effect of co-channel interference on the transmission. Additional redundant bits thus enable the receiver or, respectively, decoder to detect and possibly also to correct errors.

It has long been one of the basic premises of information theory that source encoding and channel encoding can be carried out independently of one another in order to achieve an optimum result. According to this principle, the design of the source decoder depends only on the source characteristics whereas the channel encoding arrangement should depend only on the channel characteristics. This principle can be correct if the source encoder delivers statistically independent and thus uncorrelated symbols of equal probability and the decoding delay can be of any magnitude. In practical applications, however, these prerequisites are not met, as a rule. The output signal of the source encoder or, respectively, the symbol sequences output by it frequently exhibit a residual redundancy and, at the same time, the permissible delay is restricted, especially in voice transmission.

It is known to utilize this residual redundancy of the source-encoded symbol sequences in the so-called source-controlled channel decoding. In this process, the decoding process of the channel decoder is controlled, on the one hand, by the transmitted bits and, on the other hand, by a priori/a posteriori information on the most probable value of some important source bits. The source information thus has an influence on the result of the channel decoding. In the case of the Viterbi algorithm decoding, this method is called an a priori Viterbi algorithm. When such a method is used, only the receiver needs to be modified. Thus, the printed document J. Hagenauer, "Source-controlled channel decoding", IEEE Trans. Commun., Vol. 43, pages 2449–2457, September 1995, teaches to use the inter-frame correlation, that is to say the statistical dependence between temporally and/or spatially adjacent signal samples in the source-controlled channel decoding.

Investigations have also shown that there is residual redundancy not only between bits of successive frames but also between the bits of a parameter within a frame due to the uneven distribution of the parameter values which, in turn, is attributable to the non-stationary condition of the source signals.

SUMMARY OF THE INVENTION

The present invention has the object of achieving information transmission or information storage with the fewest possible errors and the least possible expenditure.

According to the invention, the above-mentioned object is achieved.

First sorting the symbols in accordance with their relative frequency and allocating the natural binary code to the sorting result.

The invention has the result that the error rate of the decoded bits can be reduced without additional expenditure, and thus information can be transmitted with fewer disturbances.

In the text which follows, the invention will be described in greater detail with reference to preferred illustrative embodiments. In this connection, it is especially the digital transmission of the information which is described. Nevertheless, the information can also be applied to the storage of information since the writing of information to a storage medium and the reading of information from a storage medium correspond to the sending of information and the receiving of information with regard to the present invention.

The term "decoding" is frequently used for describing the decoding of channel-encoded bit positions whilst the term "detection" is used if generally the binary values of a bit position are decided. Since the present invention is advantageously applicable to both cases, the term "decoding" also contains the process of detection within the context of the present patent application.

DESCRIPTION OF THE PREFERRED EMBODIMENTS

Figure 1:
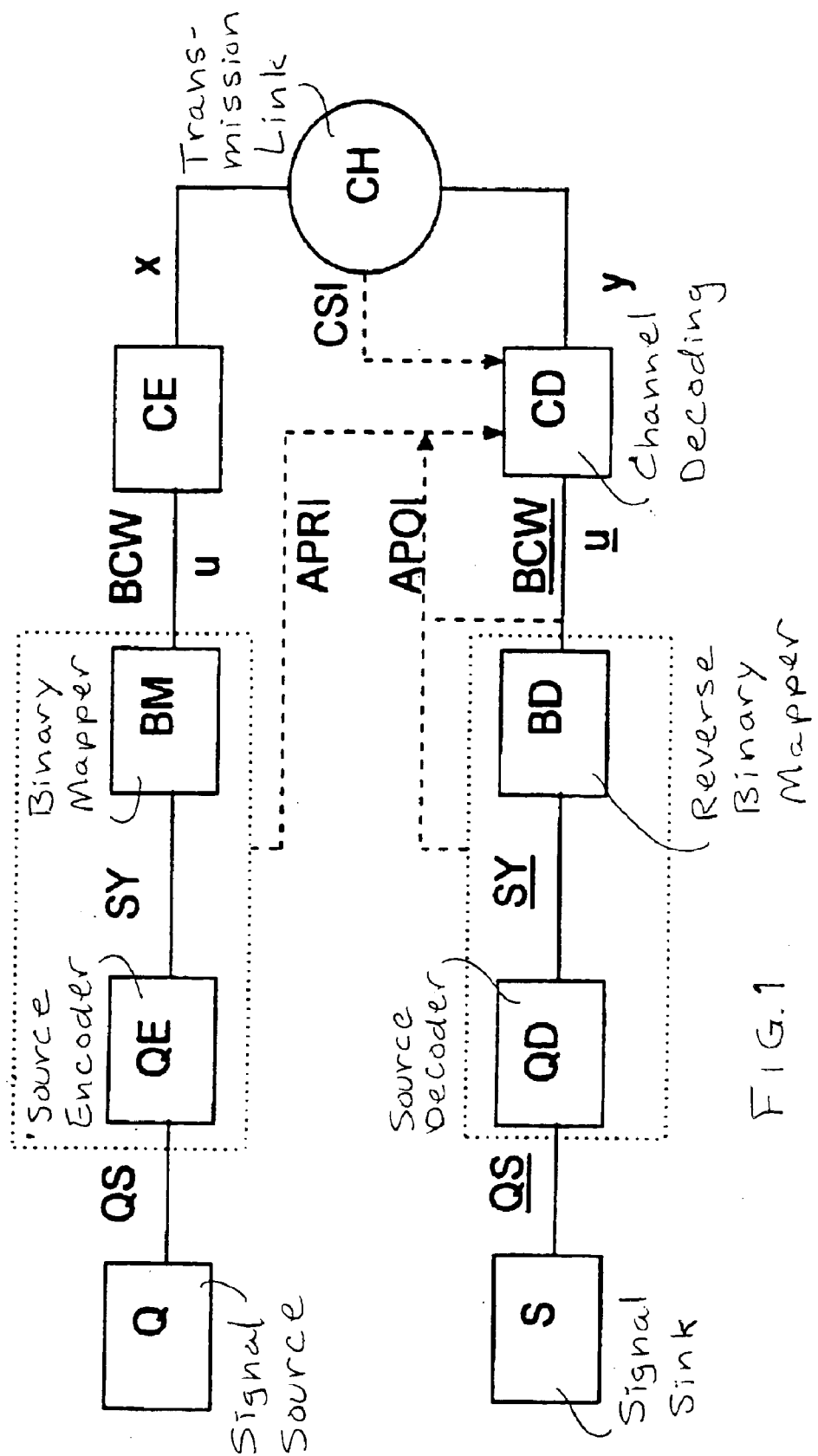
FIG. 1 is a schematic representation of a communication chain constructed and operated in accordance with the invention.

FIG. 1 shows a source Q which generates source signals QS which are compressed into symbol sequences SY consisting of symbols by a source encoder QE like the GSM full-rate voice encoder. Here, the symbols have one of the values c,j (symbol value). In parametric source encoding methods, the source signals QS (e.g. voice) generated by the source Q are subdivided into blocks (e.g. time frames) and these are processed separately. The source encoder QE generates quantized parameters (e.g. voice coefficients) which are also called symbols of a symbol sequence SY in the text which follows and which reflect the characteristics of the source in the current block in a certain manner (e.g. spectrum of the voice, filter parameter). These symbols have a certain symbol value c,j after the quantization.

Thus, for example, the GSM full-rate encoder generates 76 parameters, of which parameters 0 to 7 are the so-called LAR (logarithmic area ratio) coefficients which are generated during the LPC (linear prediction coding) analysis. Parameters 9, 26, 43 and 60 are similarity values for the so-called LTP. (long-term prediction). Each frame also contains four XMAX coefficients (or parameters) from the so-called RPE (residual pulse excitation) analysis which change only little from frame to frame.

Due to the incomplete knowledge of the source signals or restrictions in the complexity of the source encoding method, the source encoding QE can usually be implemented only suboptimally, i.e. the symbol sequences SY contained in the compressed information still contain redundant information.

Figure 2:
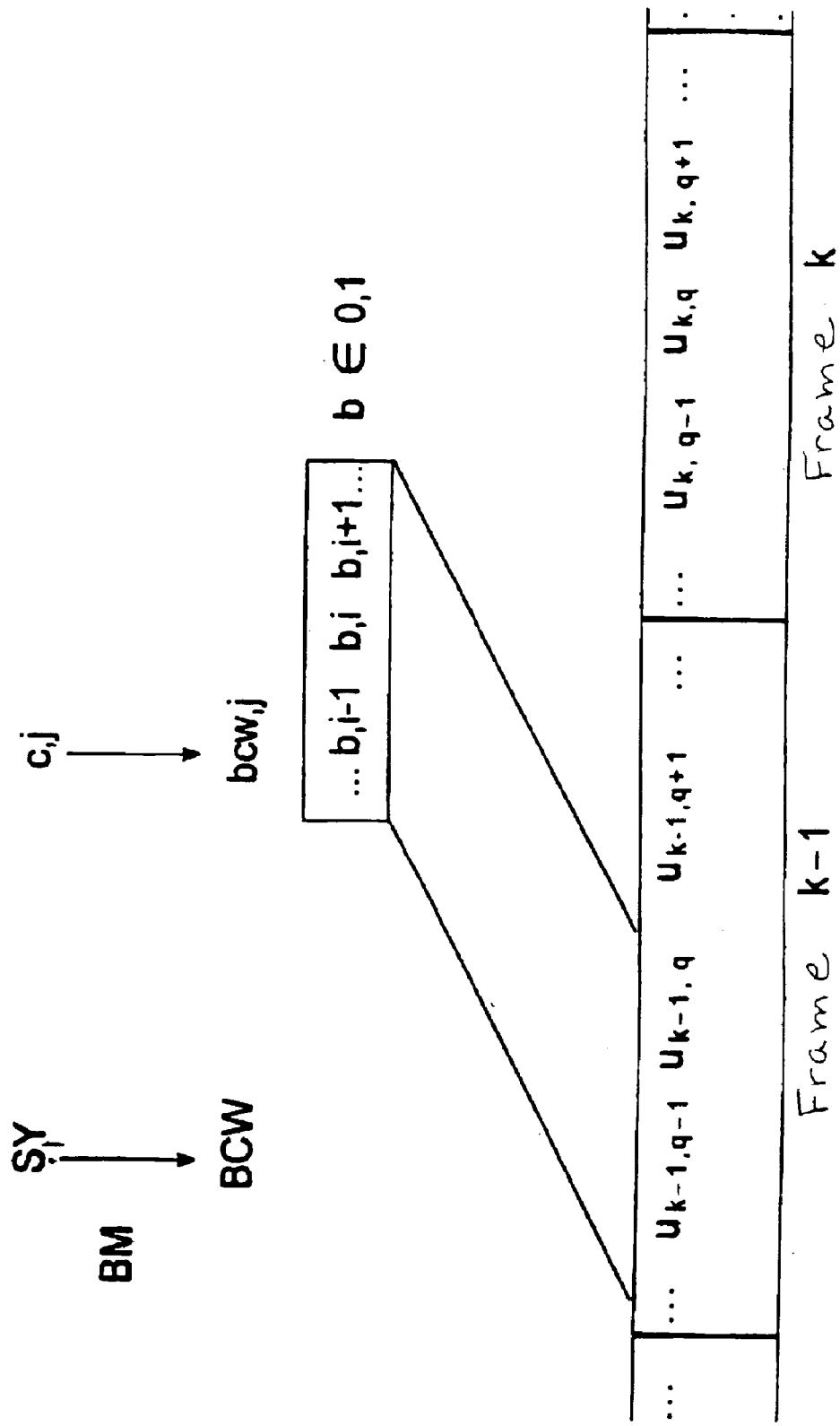
FIG. 2 is a diagram showing the relationship between symbols and the source-encoded bit sequences in a frame structure, in accordance with the invention.

As shown in FIG. 2, the symbols of the symbol sequence SY, or the corresponding symbol values c,j are mapped by a binary mapping BM (allocation rule) which is frequently described as part of the source encoding QE, to a sequence BCW of binary code words bcw,j which in each case have a number of bit positions b,i. Thus, to each symbol value c,j, a different binary code word bcw,j is allocated which differ by having different binary values at one or more bit positions b,i. In this process, the index j identifies the different values of the symbols or the different code words and the indices i and, in the text which follows, k,q identify the position at which a corresponding value is located.

If these binary code words bcw,j are processed further, for example, successively as a sequence BCW of binary code words, a sequence u of source-encoded bit positions $u_q$ is produced which can be embedded in a frame structure, each bit position $u_q$ being permanently allocated to a particular bit position b,i of a particular code word bcw,j. Thus, a frame with 260 bit positions $u_q$ is produced every 20 milliseconds, for example in GSM full-rate encoding.

FIG. 2 shows a frame structure of a frame k produced in this manner. The source-encoded bit positions $u_q$ have either the value "+1" or "−1" or "0". The index 1 runs from 0 to Q-1 within a frame, Q being the number of source-encoded bit positions $u_q$ in a frame. In each frame, the bit positions can be divided, for example, into three classes having different significance and sensitivity to co-channel interference.

The source-encoded bit sequences u are coded against co-channel interference in a channel encoder CE like a convolutional encoder, in such a manner that the lowest bit-error probability occurs in the most important class. For this purpose, the 50 most significant bits (Class 1a) are first protected by 3 bits of a cyclic redundancy check (CRC). The next 132 significant bits (Class 1b) are regrouped with the aforementioned 53 bits and, together, convolutionally encoded with a ½ rate together with four tail bits. The 78 less significant bits (Class 2) are transmitted uncoded.

These bit sequences that have been x channel-encoded in this manner are processed further in a modulator, not shown, and are then transmitted via a transmission link CH. During the transmission, disturbances occur, for example, fading, described by a fading factor ak, and noise, described by the noise vector NO.

The transmission link CH is located between a transmitter and a receiver. If necessary, the receiver contains an antenna, not shown, for receiving the signals transmitted via the transmission link CH, a sampling device, a demodulator for demodulating the signals and an equalizer for eliminating the inter-symbol interference. These devices are also not shown in FIG. 1 for reasons of simplification. Any possible interleaving and deinterleaving are also not shown.

The equalizer outputs received values of a received sequence y. Due to the interference in the transmission via the transmission link CH, the received values have values which deviate from "+1" and "−1", for example "+0.2" or "−3.7".

The channel encoding is cancelled in a channel decoder CD. For this purpose, the binary values of the individual received bit positions $\underline{u}_q$ and $\underline{b},\underline{i}$ are decided on the basis of the received values of the received sequence y. Apart from the channel status information CSI, the residual redundancy of the symbol sequences SY described above can be utilized in the so-called source-controlled or common channel decoding CD for correcting bit errors or, respectively, improving the decoding. In principle, there are two possibilities for this:

In the sense of a priori information APRI, the redundant information on the frequency of the symbol values c,j, and thus also the frequency of the binary values of certain bit positions b,i, and the correlation of the symbols to each other and thus also the correlation of the binary values of certain bit positions b,i to each other, is utilized directly in the channel decoder CD in that, for example, this information is first determined by means of some test source signals in a test source encoder or, respectively, by means of a test source encoder, and this information is then stored in a storage unit allocated to the channel decoder CD and utilized for channel decoding in that it is used, for example, for determining a threshold from which, for example, the binary value "1" is decided for a value of the received sequence y.

The redundant information on the frequency of the symbol values c,j, and thus also the frequency of the binary values of certain bit positions b,i, and the correlation of the symbols to each other and thus also the correlation of the binary values of certain bit positions b,i to each other, is determined after the channel decoding CD in the sense of a posteriori information. The a posteriori information APOI can be determined directly after the channel decoder CD or after or during the source decoding QD.

Such a method is described in "J. Hagenauer, "Source-controlled channel decoding", IEEE Trans. Commun., Vol. 43, pages 2449–2457, September 1995", especially on pages 2451 and 2452, the decoding process of the channel decoder being controlled both by the transmitted code bits and by a priori/a posteriori information on the probable value of some significant source bits. In the case of the VA (Viterbi algorithm) decoding, this method has been called Apri-VA.

For the channel decoding CD, it is also possible to use, for example, a SOVA (soft-output Viterbi algorithm). A SOVA is an algorithm which outputs not only a decision value but, furthermore, also specifies the probability with which the decided value is present.

After the completed channel decoding CD, the received channel-decoded bit sequences $\underline{u}$ or, respectively, the binary code words $\underline{bcw,j}$ contained therein are mapped back in a reverse binary mapper BD onto received symbols of received symbol sequences $\underline{SY}$ which are then processed into source signals $\underline{OS}$ in the source decoding QD and are output at the information sink S.

In the text which follows, four possible different binary mappings BM are presented:

Natural binary code NBC
Folded binary code FBC
Gray binary code GBC
Minimum distance code MBC These four binary mappings are shown by way of example with in each case 4 bit positions in the table below:

| Symbol | Code word bcw,j NBC | | | | Code word bcw,j FBC | | | | Code word bcw,j GBC | | | | Code word bcw,j MDC | | | |
|---|---|---|---|---|---|---|---|---|---|---|---|---|---|---|---|---|
| c,j | b3 | b2 | b1 | b0 | b3 | b2 | b1 | b0 | b3 | b2 | b1 | b0 | b3 | b2 | b1 | b0 |
| c0  | 0 | 0 | 0 | 0 | 0 | 1 | 1 | 1 | 0 | 0 | 0 | 0 | 0 | 1 | 1 | 1 |
| c1  | 0 | 0 | 0 | 1 | 0 | 1 | 1 | 0 | 0 | 0 | 0 | 1 | 0 | 1 | 1 | 0 |
| c2  | 0 | 0 | 1 | 0 | 0 | 1 | 0 | 1 | 0 | 0 | 1 | 1 | 0 | 1 | 0 | 1 |
| c3  | 0 | 0 | 1 | 1 | 0 | 1 | 0 | 0 | 0 | 0 | 1 | 0 | 0 | 0 | 1 | 1 |
| c4  | 0 | 1 | 0 | 0 | 0 | 0 | 1 | 1 | 0 | 1 | 1 | 0 | 0 | 1 | 0 | 0 |
| c5  | 0 | 1 | 0 | 1 | 0 | 0 | 1 | 0 | 0 | 1 | 1 | 1 | 0 | 0 | 1 | 0 |
| c6  | 0 | 1 | 1 | 0 | 0 | 0 | 0 | 1 | 0 | 1 | 0 | 1 | 0 | 0 | 0 | 1 |
| c7  | 0 | 1 | 1 | 1 | 0 | 0 | 0 | 0 | 0 | 1 | 0 | 0 | 0 | 0 | 0 | 0 |
| c8  | 1 | 0 | 0 | 0 | 1 | 0 | 0 | 0 | 1 | 1 | 0 | 0 | 1 | 0 | 0 | 0 |
| c9  | 1 | 0 | 0 | 1 | 1 | 0 | 0 | 1 | 1 | 1 | 0 | 1 | 1 | 0 | 0 | 1 |
| c10 | 1 | 0 | 1 | 0 | 1 | 0 | 1 | 0 | 1 | 1 | 1 | 1 | 1 | 0 | 1 | 0 |
| c11 | 1 | 0 | 1 | 1 | 1 | 0 | 1 | 1 | 1 | 1 | 1 | 0 | 1 | 1 | 0 | 0 |
| c12 | 1 | 1 | 0 | 0 | 1 | 1 | 0 | 0 | 1 | 0 | 1 | 0 | 1 | 0 | 1 | 1 |
| c13 | 1 | 1 | 0 | 1 | 1 | 1 | 0 | 1 | 1 | 0 | 1 | 1 | 1 | 1 | 0 | 1 |
| c14 | 1 | 1 | 1 | 0 | 1 | 1 | 1 | 0 | 1 | 0 | 0 | 1 | 1 | 1 | 1 | 0 |
| c15 | 1 | 1 | 1 | 1 | 1 | 1 | 1 | 1 | 1 | 0 | 0 | 0 | 1 | 1 | 1 | 1 |
| # (bit change) | 1 | 3 | 7 | 15 | 1 | 2 | 6 | 14 | 1 | 2 | 4 | 8 | 1 | 6 | 10 | 10 |

In known methods for source encoding, the symbols or[, respectively,] parameters have been mapped to the natural binary code NBC after the source encoding QE and source quantization in an unsorted manner. In consequence, the source-controlled channel decoding CD was also only applied to such source-encoded bit positions b,i.

If the symbols or the symbol sequences SY consisting of symbols still contain redundant information, i.e. the relative frequencies of the symbol values c,j are distributed unevenly, or some symbols are correlated to one another, there is automatically also redundant information in some bit positions b,i. In elaborate simulations with simulation methods developed especially for this purpose it was found that, due to the uneven distribution of the symbol values c,j due to the deliberate use of certain binary mappings BM, the residual redundancy contained in the symbol sequences SY can be utilized particularly well for improving the error correction in the channel decoding CD.

The present invention makes particularly good use of the residual redundancy existing in the symbol sequence SY for decoding the binary values of the bit positions or, respectively, of bit positions b,i, because instead of employing some randomly selected mapping BM for the binary mapping, the symbols or parameters are first sorted in accordance with their probability and the natural binary code is allocated to the symbol structure thus produced.

Thus, the natural binary code (NBC) is allocated to the symbols sorted in accordance with their probability of occurrence in such a manner that a code word which has the first binary value at all bit positions, or a code word which has the second binary value at all bit positions, is allocated to the symbol occurring most frequently, and a code word which exhibits the second binary value at all bit positions or a code word which exhibits the first binary value at all bit positions is allocated to the symbol occurring most rarely.

This leads to an efficient mapping of the symbol redundancy to the individual bit position redundancy; as a result, more redundant information about the binary values of the individual bit positions b,i can be utilized for error correction. In addition, more redundant information can be used for decoding the most significant bit than for decoding the second most significant bit. The decoding results can be particularly improved by a method according to the invention especially for mapping digital data or vector-quantized parameters to code words—as is shown by simulation results.

In the source-controlled channel decoding CD, the residual redundancy (uneven distribution) existing in the source-encoded symbol sequences SY can then be utilized more easily and more efficiently since the redundancy existing at the symbol level is thus converted into a redundancy (uneven distribution) existing at the bit level which can be used directly by the source-controlled channel decoder (e.g. Apri-VA). Using this method, an improved quality can be achieved in the transmission of the source signals QS (sound, voice, etc.). The additional computational effort for such sorting before binary mapping BM is low and usually can be neglected.

Such binary mapping BM can be implicitly integrated in the source encoder and decoder. For codecs which are already standardized such as the GSM full-rate/enhanced full-rate voice codec, however, it means a modification both in the receiver and in the transmitter. However, this modification is possible without any great hardware alteration. In the GSM system, it is only necessary, in terms of infrastructure, to add the binary mapping and inverse mapping in the TRAU (transcoder and rate adapter unit), the BTS (base transceiver station), BSC (base station controller) etc. remain unchanged.

Figure 3:
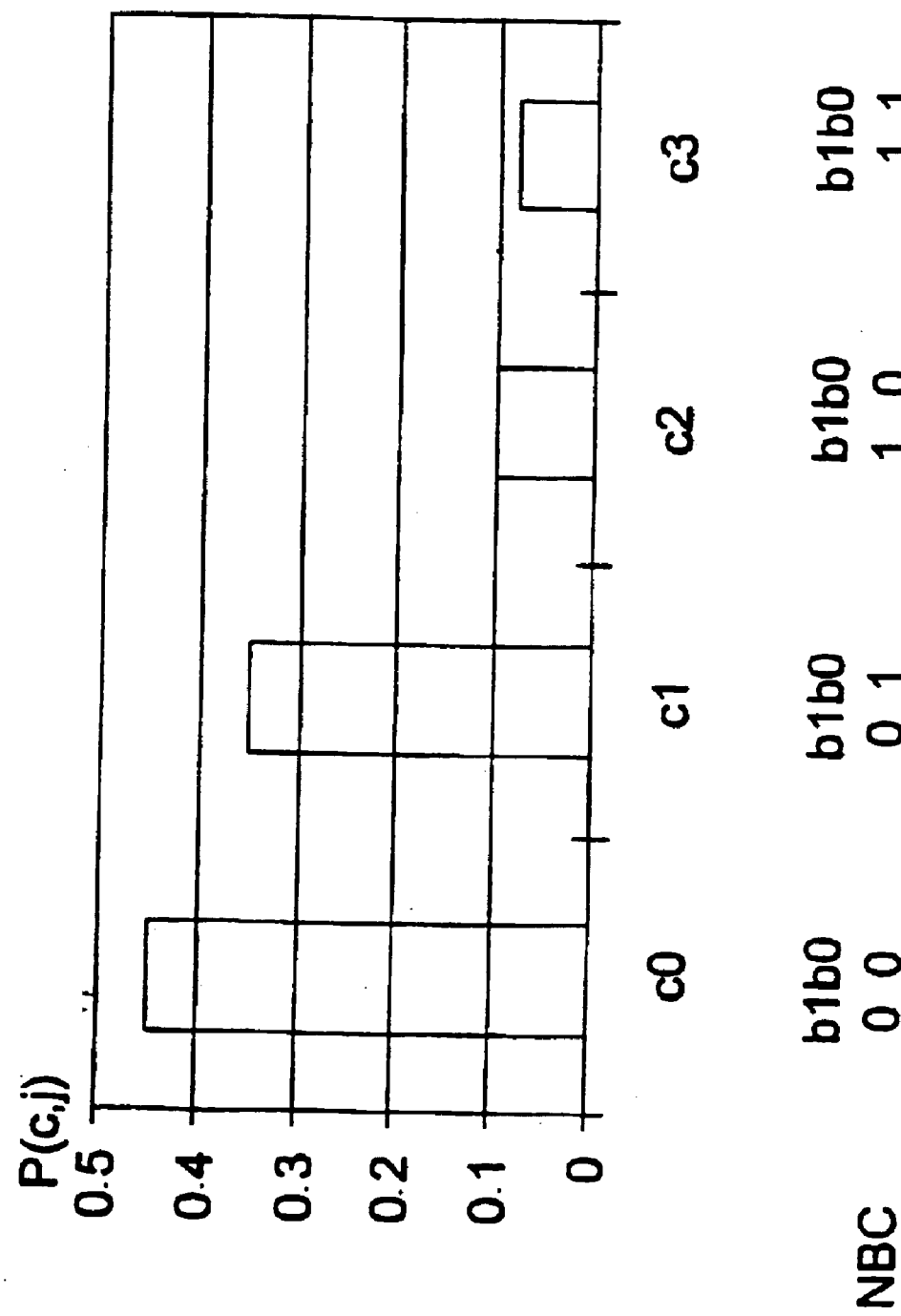
FIG. 3 illustrates the frequency distribution of the symbols and the binary values dependent on binary mapping, in accordance with the invention.

FIG. 3 shows the frequency distribution of the symbol values c,j and the allocated binary code words bcw,j. It can be seen here that in the case of the NBC at the first bit position b1, the probability for the binary value "0" is very much greater than that for the binary value "1", especially under the condition that symbol c1 or c2 has been sent. This information can be utilized in the sense of a posteriori or a priori information in the source-controlled channel decoding in order to decide the binary value of the bit position b1 or, respectively, to determine the threshold used for this, and thus to make the decision more reliable.

Thus, the decoding can be improved further if information on the symbol value c,j probably transmitted is also used.

If the symbols have not been sorted before the binary mapping, the a posteriori or a priori information (that is to say the probability for a binary value "0") used in the source-controlled channel decoding would generally be less and the decoding of the bit positions could not be carried out so reliably.

In a variant of the embodiment of the invention, all or some of the bit positions of code words are interchanged after sorting and mapping symbols onto code words.

In an embodiment of the invention, the information consisting of symbol sequences SY is mapped to binary code words bcw,j having in each case a plurality of bit positions b,i in such a manner that even the correlation between the binary values of the corresponding bit positions b,i,k (or uq,k at frame level) and b,i,k+1 (or uq,k+1 at frame level) of successive frames k, k+1 is large. In this arrangement, in particular, a correlation of the source bits is taken into consideration. The basic concept of this method consists in that corresponding symbols do not change very often between two successive frames and there is thus a redundancy in the transmission. This correlation between successive frames can be utilized especially well at the receiver end, using an APRI SOVA (a priori soft-output Viterbi algorithm) decoder if a binary mapping BM is selected in such a manner that the correlation between the binary values of the corresponding bit positions of the successive frames is large.

In elaborate simulations, the use of the GBC as binary mapping has thus been found to be particularly advantageous, especially if the symbols have a Gaussian or an anti-Gaussian distribution which is often the case.

In source-controlled channel decoding CD, the interframe correlation, that is to say the statistical dependence between temporally and/or spatially adjacent signal samples can also be utilized. To estimate the a priori/a posteriori information, for example, the empirical "HUK algorithm", which is described in "J. Hagenauer, "Source-controlled channel decoding", IEEE Trans. Commun., Vol. 43, pages 2449–2457, September 1995", or a method based on Kalman filters can also be used for source-controlled channel decoding.

In a further variant of the embodiment, the information consisting of symbol sequences SY is mapped to binary code words bcw,j having in each case a plurality of bit positions b,i in such a manner that, in the case of a wrongly detected binary value, the error in the detected symbol or, respectively, the output source signal QS is small. By means of a suitable binary mapping EM, the source signals will thus respond less sensitively to co-channel interference. In elaborate simulations, the use of the FBC as binary mapping has thus been found to be particularly advantageous, especially if the symbols have a Gaussian or an anti-Gaussian distribution which is often the case.

Variants of the embodiment are also possible in which the binary mapping BM is selected in such a manner that a number of aspects of the variants described above are combined in the sense of a compromise.

To carry out the method explained above, a program-controlled signal processor integrated, for example, in radio equipment, such as a mobile station or base station of a mobile radio system, is provided which uses one of the methods described above for coding and/or decoding information to be transmitted.

Although modifications and changes may be suggested by those skilled in the art, it is the intention of the inventors to embody within the patent warranted hereon all changes and modifications as reasonably and properly come within the scope of the inventor's contribution to the art.

I claim:

1. A method for coding information consisting of symbol sequences containing symbols which occur with different probabilities, comprising the steps of:

mapping said symbols to binary code words, each having a plurality of bit positions; and in said mapping, sorting said symbols dependent on their respective probability of occurrence, and allocating a natural code words to said symbols to obtain sorted symbols, and allocating a natural binary code to said sorted symbols.

2. A method as claimed in claim 1 wherein the step of sorting said symbols comprises sorting a substantial proportion of said symbols, thereby obtaining a substantial proportion of sorted symbols, and comprising allocating said natural binary code to said substantial proportion of sorted symbols.

3. A method as claimed in claim 1 wherein the step of sorting said symbols comprises sorting all of said symbols, and allocating said natural binary code to all of said sorted symbols.

4. A method as claimed in claim 1 wherein the step of allocating said natural binary code comprises:

allocating a code word which exhibits a first binary value at all bit positions to a symbol which occurs most frequently; and allocating a code word which exhibits a second binary value at all positions to a symbol occurring most infrequently.

5. A method as claimed in claim 1 comprising producing said symbol sequences from a source encoding.

6. A method as claimed in claim 1 comprising interchanging bit positions of code words obtained from said mapping.

7. A method as claimed in claim 1 wherein said symbol sequences contain redundant information, and comprising decoding said natural binary code using said redundant information as a priori information for determining respective values of said bit positions.

8. A method as claimed in claim 1 wherein said symbol sequences contain redundant information, and comprising decoding said natural binary code using said redundant information as a posteriori information for determining respective values of said bit positions.

9. A method as claimed in claim 1 wherein said bit positions of said code words contain redundant information, and comprising decoding said natural binary code using said redundant information as a priori information for determining respective values of said bit positions.

10. A method as claimed in claim 1 wherein said bit positions of said code words contain redundant information, and comprising decoding said natural binary code using said redundant information as a posteriori information for determining respective values of said bit positions.

11. A signal processing arrangement for coding information consisting of symbol sequences containing symbols which occur with different probabilities, comprising the steps of:

mapping said symbols to binary code words, each having a plurality of bit positions; and in said mapping, sorting said symbols dependent on their respective probability of occurrence, and allocating a natural code words to said symbols to obtain sorted symbols, and allocating a natural binary code to said sorted symbols.

12. A signal processing arrangement as claimed in claim 11 wherein said symbol sequences contain redundant information, and comprising decoding said natural binary code using said redundant information as a priori information for determining respective values of said bit positions.

* * * * *